(12) United States Patent
Bonhoure et al.

(10) Patent No.: US 6,215,427 B1
(45) Date of Patent: Apr. 10, 2001

(54) ANALOG-DIGITAL CONVERSION DEVICE COMPRISING A DIFFERENTIAL COMPARATOR

(75) Inventors: Bruno Bonhoure, Murat; Frédéric Palllardet, Aix les Bains; Thierry Rouzier, Grenoble, all of (FR)

(73) Assignee: Thomson multimedia, Boulogne-Billancourt (FR)

( * ) Notice: Subject to any disclaimer, the term of this patent is extended or adjusted under 35 U.S.C. 154(b) by 0 days.

(21) Appl. No.: 09/170,867

(22) Filed: Oct. 13, 1998

(30) Foreign Application Priority Data

Oct. 14, 1997 (FR) .................................................. 97 12838

(51) Int. Cl.$^7$ ...................................................... H03M 1/10
(52) U.S. Cl. .......................................... 341/118; 341/122
(58) Field of Search .................................... 341/118, 120, 341/122, 139; 348/692, 708

(56) References Cited

U.S. PATENT DOCUMENTS

| 4,571,507 | * | 2/1986 | Collings | 307/350 |
| 4,602,374 | * | 7/1986 | Nakamura et al. | 341/118 |
| 4,633,223 | * | 12/1986 | Senderowicz | 341/118 |
| 4,875,049 | * | 10/1989 | Yoshida | 341/139 |

FOREIGN PATENT DOCUMENTS

| 388 130 A2 | 9/1990 | (EP) | H03M/1/12 |
| 91/15899 | 10/1991 | (WO) | H03M/1/14 |

* cited by examiner

*Primary Examiner*—Howard L. Williams
(74) *Attorney, Agent, or Firm*—Joseph S. Tripoli; Eric P. Hermann; Ronald H. Kurdyla

(57) ABSTRACT

An analog to digital converter transposes the input signal into two differential signals, which are applied to respective inputs of a differential comparator. The output of the differential comparator is linked to the input of the analog-digital converter by a circuitry loop for restoring a DC component of each of the differential signals at the mid-voltage of the conversion range of the analog-digital converter.

4 Claims, 3 Drawing Sheets

ANALOG-DIGITAL CONVERSION DEVICE COMPRISING A DIFFERENTIAL COMPARATOR

BACKGROUND OF THE INVENTION

The invention relates to an analog-digital conversion device, especially adapted to the reception of signals transmitted by cable.

The basis of the invention has consisted in developing a conversion device suitable for the analog-digital conversion of a 256 QAM modulated signal within the frequency spectrum from 3.2 to 11.2 MHz and with a peak-to-peak dynamic swing of 1 volt, the input signal being applied via a capacitive coupling.

The capacitive coupling causes the loss of the continuous component of the input signal. The device will therefore have to take this into account. On the other hand, the dynamic swing of the signal is just 1 volt peak-to-peak, which is not much. This problem will also have to be taken into account. Lastly, an attempt will be made to minimize certain forms of noise.

SUMMARY OF THE INVENTION

The subject of the invention is a device for the analog-digital conversion of an input signal, characterized in that it comprises:

- means for transposing the input signal into two differential signals;
- means for restoring a continuous component of each of the differential signals at the mid-voltage of the conversion range of an analog-digital converter;
- at least one differential comparator whose output is linked to the input of the analog-digital converter and whose two differential inputs respectively receive one of the two differential signals.

By employing at least one differential comparator it is possible on the one hand to double the dynamic swing of the signal, the two differential signals having opposite excursions with respect to a restored continuous component, and on the other hand to overcome the common-mode noise.

The function of the means for restoring the continuous component is to centre the continuous component on the mid-voltage of the conversion range of the converter, so as to limit the saturation of the converter.

According to a particular embodiment, the means for restoring a continuous component comprise in series a low-pass filter intended to filter the digital word output by the converter and a switched current source intended to charge or discharge a storage capacitor as a function of the most significant bit at the output of the filter.

According to a particular embodiment, the means for transposing the input signal to a first of the two differential signals comprise a subtracter and an adder which are intended to add the input signal to twice the mid-voltage of the conversion range of the converter and to subtract therefrom the restored continuous component.

According to a particular embodiment, the means for transposing the input signal to a second of the two differential signals comprise a subtracter and an adder which are intended to subtract the input signal from the restored continuous component.

According to a particular embodiment, the device furthermore comprises amplifiers used as buffers respectively for the input voltage, the mid-voltage of the reference range of the converter and the restored continuous component.

Other characteristics of the invention will emerge via the description of a particular non-limiting illustrative embodiment depicted by the accompanying figures.

DESCRIPTION OF THE PREFERRED EMBODIMENT

Figure 1:
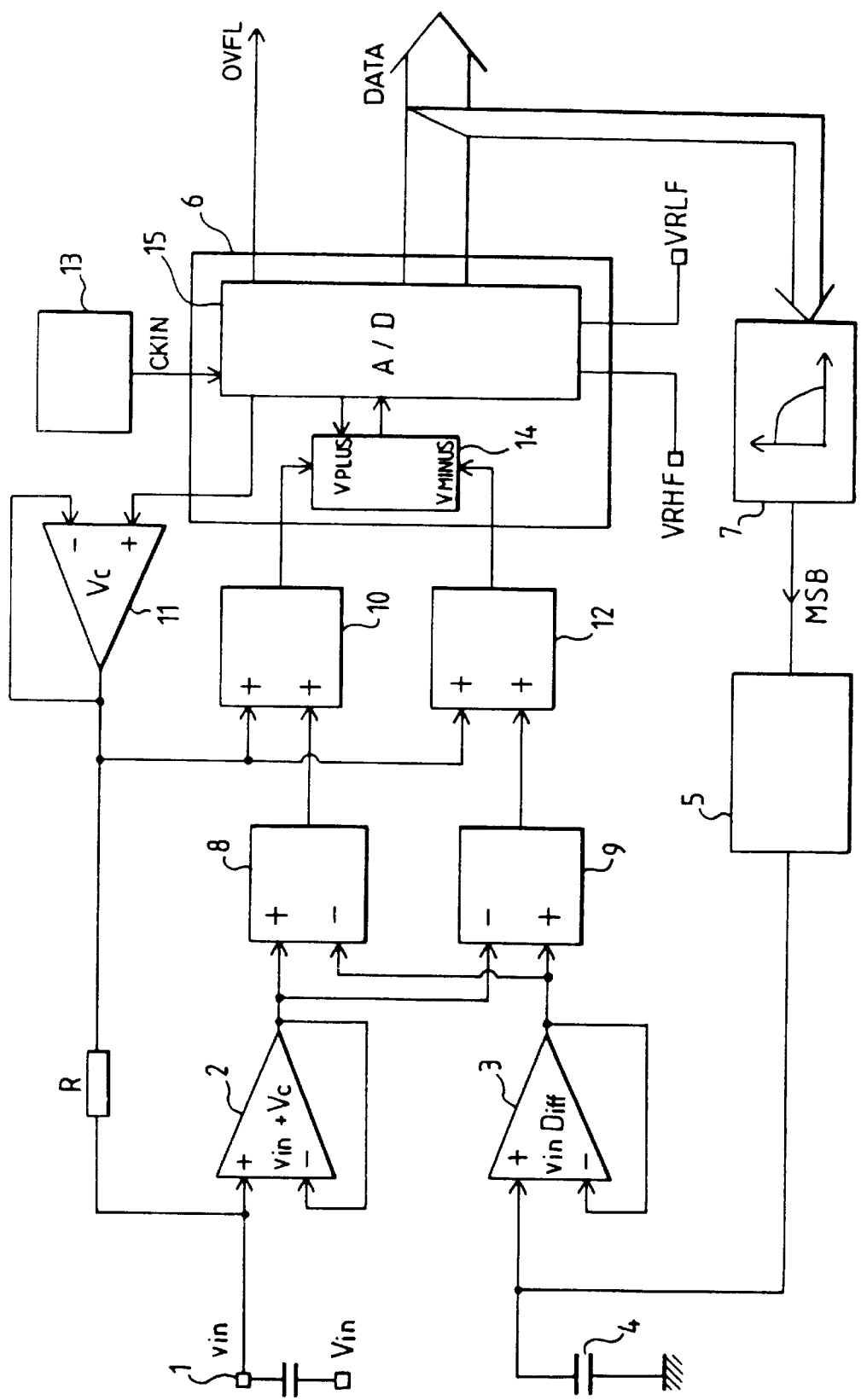
FIG. 1 is a block diagram of an analog-digital conversion device in accordance with the present illustrative embodiment.

The device depicted in FIG. 1 comprises an input 1 to which is applied an input signal vin (dynamic component of the signal Vin). The input 1 is connected to the positive input of a unit-gain operational amplifier 2, used as a buffer, the output of this amplifier looping back to its negative input. The positive input of the amplifier also receives a voltage Vc via a resistor. The function and the generation of this voltage will be seen later.

A second amplifier 3, also mounted as a buffer, receives on its positive input a voltage VinDiff, stored in a storage capacitor 4. The storage capacitor 4 is charged or discharged by a clamping circuit 5. This clamping circuit 5 is controlled by the value of the most significant bit (MSB) at the output of a low-pass filter 7. This low-pass filter filters the digital word at the output of the 10-bit differential analog-digital converter referenced 6. The characteristics of the filter are, by way of example, a cutoff frequency of 80 KHz and an attenuation of −60 dB at 4 KHz, the filter being an infinite impulse response filter. It is advantageous to use all the bits of the output word from the converter 6 to obtain a clean filtered MSB value, but it would be possible to filter just some of them (preferably the most significant bit or bits) so as to simplify the filter 7.

The clamping circuit comprises two current sources Io and −Io, the clamping capacitor being charged by Io or discharged by −Io depending on the value of the most significant bit filtered. The values of the capacitor 4 and of the current Io are determined as a function of the sampling frequency of the converter and of its resolution.

The output of the amplifier 2 (value of vin+Vc) is linked to the positive input of an amplifier 8 mounted as a subtracter. The negative input of this subtracter is linked to the output of the amplifier 3 (value of VinDiff).

The output of the subtracter 8 therefore delivers the difference (vin+Vc−VinDiff).

This output is linked to a first input of an amplifier 10 mounted as an adder with two inputs, the second input of which receives the output from a buffer amplifier 11 of a signal Vc, which represents the mid-value of the conversion range of the converter 6.

The output of the adder 10 therefore delivers the sum (vin+Vc−VinDiff)+Vc.

This output is linked to the positive input Vplus of the differential converter 6.

A second amplifier 9 mounted as a subtracter receives on its negative input the output from the amplifier 2 (value of vin+Vc) and on its positive input the output from the amplifier 3 (value of VinDiff), the reverse of the subtracter 8.

The output of the subtracter 9 therefore delivers the difference (VinDiff−vin−Vc).

The output of the subtracter 9 is linked to an input of an adder 12, similar to the adder 10. The second input of the adder 12 also receives the signal Vc output by the buffer 11.

The output of the adder 12 therefore delivers the sum (VinDiff−vin−Vc)+Vc.

This output is linked to the negative input Vminus of the differential converter 6.

The converter 6 comprises as input a unit-gain auto-zero differential comparator 14 whose output is linked to a circuit with shift register and successive comparisons 15. These two elements will be described in greater detail in conjunction with FIG. 2. The circuit 15 is linked to a digital-analog converter (not depicted in FIG. 1), which is suitable for generating reference voltages for the comparator 14 from the contents of the register of the circuit 15.

The circuit 15 receives the following signals: a clock signal CKIN produced by an oscillator 13, a reference voltage VRLF representing the low voltage of the conversion range, and a reference voltage VRHF representing the high voltage of this range. The circuit 15 outputs the 10 bits of the converted input signal (DATA), an overflow bit OVFL and the mid-value Vc of the conversion range.

The static mode of operation of the device, in the absence of signal vin, is as follows. The signals input to the converter, Vplus and Vminus, are respectively equal to:

Vplus=Vc−VinDiff+Vc=2Vc−VinDiff

Vminus=−Vc+VindDiff+Vc=VinDiff

Now, the clamping loop tends to equalize these two voltages. This is because when Vplus is greater than Vminus, then the most significant bit output by the converter 6 will be at 1, which will have the effect of charging the clamping capacitor 4, thus increasing Vminus and decreasing Vplus. On the other hand, when Vplus is smaller than Vminus, the clamping capacitor is discharged.

This amounts to saying that VinDiff converges to Vc, the mid-value of the conversion range. Thus, the continuous component of the input signal is recovered at the mid-voltage of the conversion range.

Under dynamic conditions, assuming that convergence of VinDiff to Vc has been achieved, Vplus will be equal to Vc+vin, and Vminus to Vc−vin.

The use of a differential comparator has the effect of doubling the dynamic swing of the signal to be converted which, within the framework of the present example, goes from 1 volt peak-to-peak to 2 volts peak-to-peak.

Moreover, by employing this differential comparator it is possible to overcome the common-mode noise.

Figure 2:
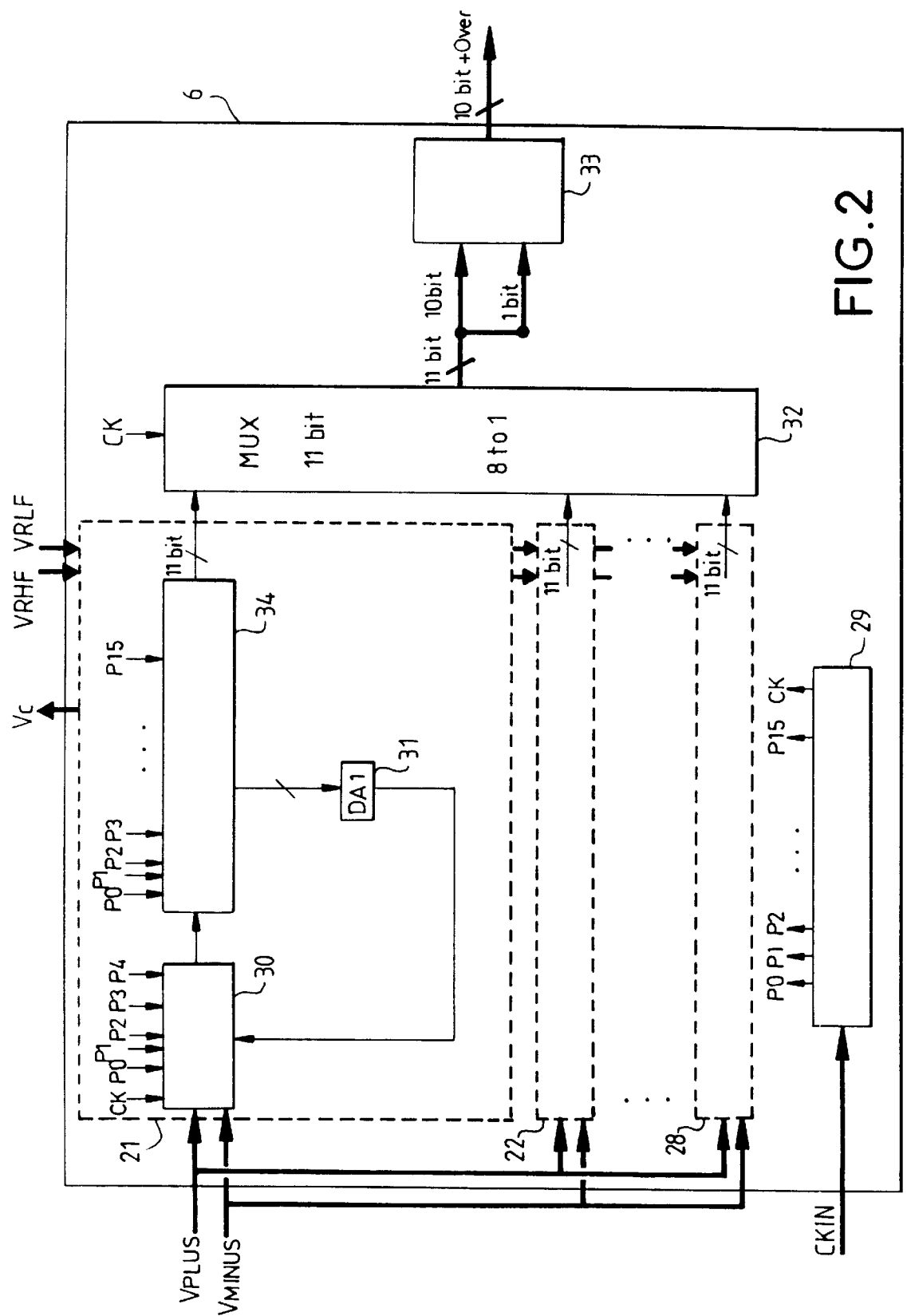
FIG. 2 is a block diagram of a differential converter according to a variant of the present embodiment and FIG. 3 represents an electrical diagram of a differential auto-zero comparator according to the present embodiment and the variant of FIG. 2.

FIG. 2 is a block diagram of a converter 6 comprising eight differential conversion circuits 21 to 28 operating in parallel in a shifted manner. This converter is used, according to one variant, instead of that of FIG. 1 so as to increase the operating frequency of the converter. The clock signal CKIN input to the converter 6 is used by a clock generation circuit 29 which generates all the clock signals necessary for the operation of the converter.

The conversion circuits possess a structure with successive approximations and sample the input signal sequentially. Each conversion circuit requires 16 clock cycles to produce a word of 10 bits, and consequently the sampling frequency of the converter and the frequency of output of the binary words at the output of the converter are equal to half the frequency of the clock 13.

Each of the differential conversion circuits 21 to 28 comprises in series a differential auto-zero comparator 30 and a circuit 34 with 11-bit shift register, these 11 bits being accessible in parallel at the output. The auto-zero comparator comprises two inputs which are intended to receive the differential signals Vplus and Vminus. A digital-analog converter 31 generates a comparison voltage from the contents of the register 31 and applies it to the input of the auto-zero comparator.

The auto-zero comparator 14 of FIG. 1 is identical to the differential auto-zero comparators 30 of FIG. 2. Likewise, the shift register circuit 15 of FIG. 1 is identical to the circuits 34 of FIG. 2.

The 11 bits output by each differential comparison circuit contain 10 effective bits and 1 overflow bit. The eight parallel outputs of the eight comparison circuits 21 to 28 are multiplexed by a multiplexer towards an output buffer 33. The multiplexer 32 is linked to a clock CK generated by the circuit 29 and sequentially selects the outputs of the eight comparison circuits.

Phases P0 to P15 are also generated by the circuit 29. They condition the comparison sequence of the eight comparison circuits. The phase signals applied to two successive comparison circuits are shifted by two cycles: the sampling performed by two successive comparison circuits is therefore likewise shifted by two cycles, as is the instant at which the 11 bits output by these two comparison circuits are available.

In each case, the first four phases (P0 to P3 for the first comparator of the circuit 21) are used to calibrate the auto-zero comparator, whilst the following eleven phases are used to determine the 10 useful bits and a correction bit. The useful bits are determined from the highest to the lowest, the comparison voltage at the output of the digital-analog converter being adapted after each bit is determined. The last phase is used for transfer to the multiplexer 32.

Figure 3:
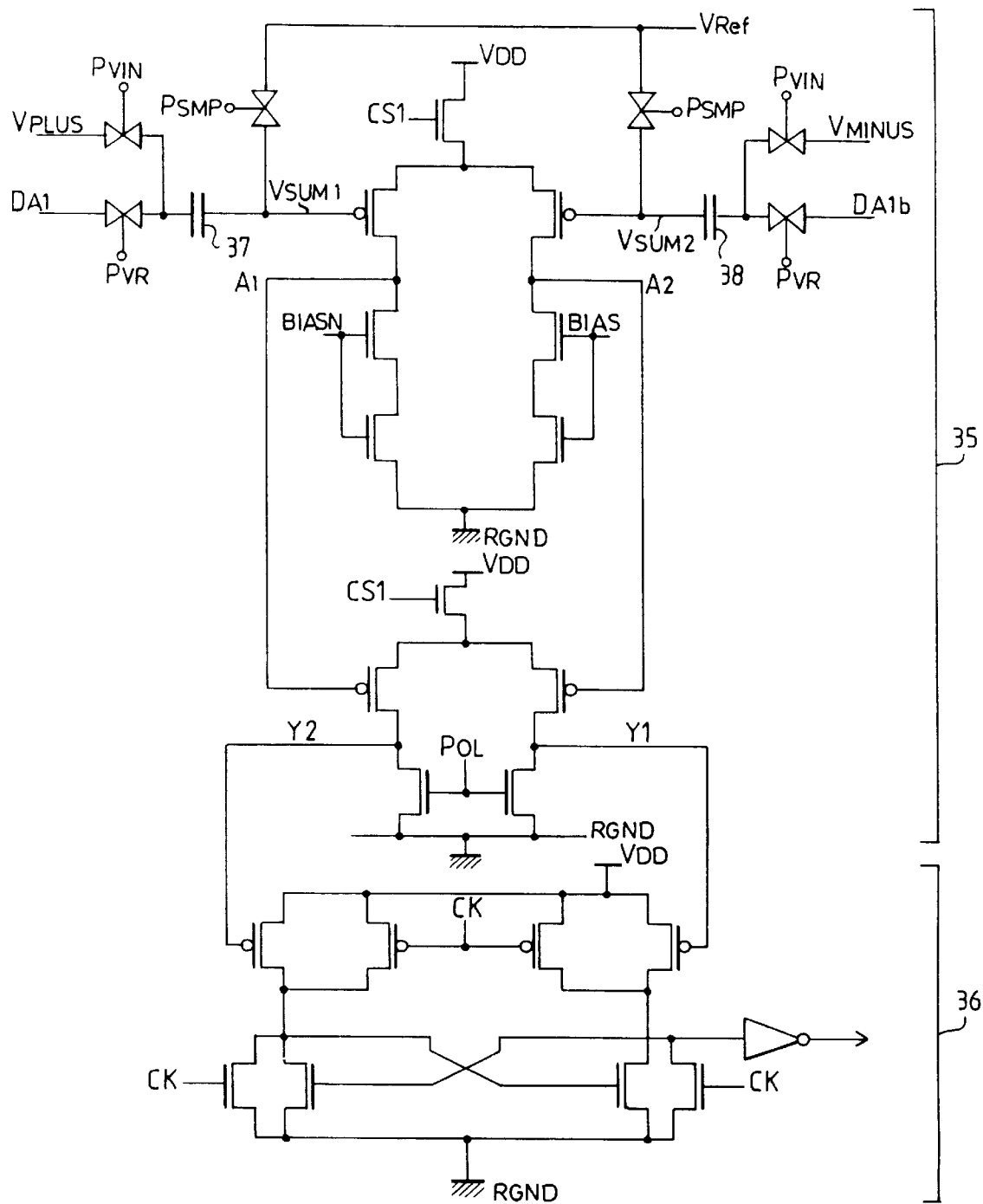

An auto-zero comparator used within the framework of the present example is depicted in FIG. 3. The auto-zero comparator comprises a differential amplifier 35 with two PMOS stages controlling a flip-flop 36. The input signals are sampled on capacitors 37 and 38, while at the same time linking them to a reference voltage Vref (control of the interrupters PSMP) and respectively to Vplus and Vminus (control of the interrupters PVIN). The interrupters PSMP are subsequently open, and then the interrupters PVIN. The interrupters PVR are then closed, causing the comparator to toggle. The output of the comparator (signals Y1 and Y2) is stored in the flip-flop 36, the output of which is connected to the register circuit 34.

The signals Vref and CS1 are static biasing signals. The signals BIAS and BIASN are generated during the phase of auto-calibration of the comparator. These two voltages converge to the same value and serve to compensate for any comparator matching errors.

What is claimed is:

1. Device for the analog-digital conversion of an input signal comprising:

means for transposing the input signal into two differential signals including a subtracter and an adder which are arranged to add the input signal to twice the mid-voltage of the conversion range of the converter and to subtract therefrom the restored continuous component;

means for restoring a continuous component of each of the differential signals at the mid-voltage of the conversion range of an analog-digital converter;

at least one differential comparator whose output is coupled to the input of the analog-digital converter and whose two differential inputs respectively receive one of the two differential signals.

2. Device according to claim 1, furthermore comprising amplifiers used as buffers respectively for the input voltage, the mid-voltage of the reference range of the converter and the restored continuous component.

3. Device for the analog-digital conversion of an input signal comprising:

means for transposing the input signal into two differential signals including a subtracter and an adder which are arranged to add the input signal to twice the mid-voltage of the conversion range of the converter and to subtract therefrom the restored continuous component;

means for restoring a continuous component of each of the differential signals at the mid-voltage of the conversion range of an analog-digital converter including in series a low-pass filter connected to filter the digital word output by the converter and a switched current source conditioned to charge or discharge a storage capacitor as a function of the most significant bit at the output of the filter;

at least one differential comparator whose output is coupled to the input of the analog-digital converter and whose two differential inputs respectively receive one of the two differential signals.

4. Device for the analog-digital conversion of an input signal comprising:

means for transposing the input signal into a second of two differential signals including a subtracter and an adder which are intended to subtract the input signal from the restored continuous component;

means for restoring a continuous component of each of the differential signals at the mid-voltage of the conversion range of an analog-digital converter;

at least one differential comparator whose output is coupled to the input of the analog-digital converter and whose two differential inputs respectively receive one of the two differential signals.

* * * * *